US011250315B2

United States Patent
Bragaglia et al.

(10) Patent No.: US 11,250,315 B2
(45) Date of Patent: Feb. 15, 2022

(54) ELECTROCHEMICAL DEVICE OF VARIABLE ELECTRICAL CONDUCTANCE

(71) Applicant: INTERNATIONAL BUSINESS MACHINES CORPORATION, Armonk, NY (US)

(72) Inventors: Valeria Bragaglia, Thalwil (CH); Patrick Ruch, Pratval (CH); Antonio La Porta, Kilchberg (CH); Jean Fompeyrine, Waedenswil (CH); Stefan Abel, Zürich (CH)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 81 days.

(21) Appl. No.: 16/666,458

(22) Filed: Oct. 29, 2019

(65) Prior Publication Data
US 2021/0125043 A1    Apr. 29, 2021

(51) Int. Cl.
*G11C 11/54*    (2006.01)
*G06N 3/063*    (2006.01)
*G11C 13/00*    (2006.01)

(52) U.S. Cl.
CPC ............ *G06N 3/063* (2013.01); *G11C 11/54* (2013.01); *G11C 13/004* (2013.01); *G11C 13/0009* (2013.01)

(58) Field of Classification Search
CPC ................................ G11C 11/54; G06N 3/063
USPC ........................................................ 365/148
See application file for complete search history.

(56) References Cited

U.S. PATENT DOCUMENTS

| | | | |
|---|---|---|---|
| 6,768,157 B2 | 7/2004 | Krieger | |
| 8,115,282 B2 | 2/2012 | Mege | |
| 10,429,343 B1* | 10/2019 | Talin | ........... H01L 45/1266 |
| 10,651,379 B2* | 5/2020 | Brew | ............. H01L 45/1266 |
| 2008/0043515 A1 | 2/2008 | Bloch | |
| 2010/0003600 A1* | 1/2010 | Niessen | ......... H01M 10/0585 |
| | | | 429/211 |
| 2018/0205011 A1 | 7/2018 | Brew | |
| 2018/0260694 A1* | 9/2018 | Bedell | ............... G06N 3/084 |
| 2018/0277552 A1* | 9/2018 | Huang | ............. H01L 45/085 |
| 2018/0293487 A1 | 10/2018 | Copel | |

(Continued)

OTHER PUBLICATIONS

Flller et al., "Li-Ion Synaptic Transistor for Low Power Analog Computing", Advanced Science News, 2017, pp. 1-8.*

(Continued)

*Primary Examiner* — Muna A Techane
(74) *Attorney, Agent, or Firm* — Anthony Curro

(57) ABSTRACT

An electrochemical device includes an electrochemical cell and an electric circuit. The electrochemical cell comprises a first solid component and a second solid component. The two solid components comprise same chemical elements but have different concentrations of at least one type of the chemical elements. A solid electrolyte is arranged between the two solid components. The solid electrolyte is a dielectric material. The electric circuit is connected to the electrochemical cell. The electrochemical cell may be operated according to a redox process, so as to exchange chemical elements of the at least one type between the first solid component and the second solid component and thereby change an electrical conductance of each of the two solid components.

15 Claims, 6 Drawing Sheets

(56) References Cited

U.S. PATENT DOCUMENTS

2019/0165356 A1* 5/2019 Li .................. H01M 4/64
2019/0214082 A1 7/2019 Li

OTHER PUBLICATIONS

Gerasimov et al., "An Evolvable Organic Electrochemical Transistor for Neuromorphic Applications", Advanced Science Open Access, 2019, pp. 1-8.*
Lee et al., "Graphene-ZnO:N Schottky junction based thin film transistor", IEEE, 2017, pp. 1-4.*
Tang et al., "ECRAM as Scalable Synaptic Cell for High-Speed,low-Power Neuromorphic Computing", IEEE, 2018, pp. 13.1.1-13.1.4.*
Gokmen,et al.,"Acceleration of Deep Neural Network Training with Resistive Cross-Point Devices:Design 4G onsiderations," Front. Neurosci.10:333,dol.org/10.3389/inins.2016.00333,Jul. 21, 2016,10 ogs.,[accessed t Oct. 22, 2021].*
Fuller et al., "Li-Ion Synaptic Transistor for Low Power Analog Computing", Advanced Science News, 2017, pp. 1-8.
NPL_LEE et al., "Graphene-ZnO:N Schottky junction based thin film transistor", IEEE, 2017, pp. 1-4.
Sharbati et al., "Low-Power, Electrochemically Tunable Graphene Synapses for Neuromorphic Computing", Advanced Materials, 2018, pp. 1-6.

Van De Burgt et al., "A non-volatile organic electrochemical device as a low-voltage artificial synapse for neuromorphic computing", www.nature.com/naturematerials, Nature Materials, vol. 16, Apr. 2017, pp. 414-419.
Yang et al., "All-Solid-State Synaptic Transistor with Ultralow Conductance for Neuromorphic Computing", Synaptic Electronics, Advanced Functional Materials, 2018, pp. 1-10.
Yang_Ding, "Ultrafast Zn2+ Intercalation and Deintercalation in Vanadium Dioxide", Advanced Materials, 2018, pp. 1-6.
Zhu et al., "Ion Gated Synaptic Transistors Based on 2D van der Waals Crystals with Tunable Diffusive Dynamics", Advanced Materials, 2018, pp. 1-11.
Notification of Transmittal of the International Search Report and Written Opinion of the International Searching Authority, or the Declaration, International application No. PCT/EP2020/079177, Applicant's or agent's file reference P201901896PCT01, dated Jan. 26, 2021, 13 pages.
Gokmen, et al., "Acceleration of Deep Neural Network Training with Resistive Cross-Point Devices: Design Considerations," Front. Neurosci. 10:333, doi.org/10.3389/fnins.2016.00333, Jul. 21, 2016, 10 pgs., [accessed Oct. 22, 2021], Retrieved from the Internet: <https://www.frontiersin.org/articles/10.3389/fnins.2016.00333/full>.

* cited by examiner

ELECTROCHEMICAL DEVICE OF VARIABLE ELECTRICAL CONDUCTANCE

FIELD

The invention relates in general to the field of electrochemical devices with solid electrolytes. In particular, it is directed to electrochemical devices comprising an electrical circuit to change an electrical conductance of a solid component of the devices. An electrochemical device according to various embodiments can advantageously be used as a synaptic element in a neuromorphic hardware apparatus, for example. The invention also relates to methods to operate electrochemical devices.

BACKGROUND

Machine learning often relies on artificial neural networks (ANNs), which are computational models inspired by biological neural networks in human or animal brains. An ANN comprises a set of connected units or nodes, called artificial neurons. Signals are transmitted along connections (also called edges) between artificial neurons, similarly to synapses. That is, an artificial neuron that receives a signal processes it and then signals connected neurons. Connection weights (also called synaptic weights) are associated with the connections and nodes. Each neuron may have several inputs and a connection weight is attributed to each input (the weight of that specific connection). Such weights adjust as learning proceeds.

Neural networks are typically implemented in software. However, a neural network may also be implemented in hardware, e.g., as a resistive processing unit (relying on crossbar array structures) or an optical neuromorphic system. That is, a hardware-implemented ANN is a physical machine that clearly differs from a classic computer (general- or specific-purpose computer) in that it is primarily and specifically designed to implement an ANN (for training and/or inference purposes). Synaptic elements used in neuromorphic hardware apparatuses typically comprise a memristive device, e.g., a phase-change memory device, a resistive random-access memory (RRAM), or a magnetic random-access memory (SRAM).

Aside from neuromorphic hardware apparatuses, various electrochemical devices are known. Electrochemical cells are devices configured to generate electrical energy from chemical reactions or, conversely, to leverage electrical energy to cause some chemical reactions. Solid state electrochemical capacitors have been proposed, as well as computer memory element based on such capacitors, in particular electrochemical random-access memory (ECRAM) devices see, e.g., Sharbati, Mohammad Taghi, et al., "Artificial Synapses: Low-Power, Electrochemically Tunable Graphene Synapses for Neuromorphic Computing (Adv. Mater. 36/2018).", Advanced Materials 30.36 (2018): 1870273, and J. Tang. et al., "ECRAM as Scalable Synaptic Cell for High-Speed, Low-Power Neuromorphic Computing", IEDM, p. 13.1.1, 2018.

SUMMARY

In various embodiments, an electrochemical device includes an electrochemical cell. The electrochemical cell may include a first solid component and a second solid component. In addition, the electrochemical cell may include a first solid electrolyte and an electric circuit. The a first solid component may be comprised of one or more particular chemical elements, wherein a first chemical element of the one or more particular chemical elements is present in a first concentration in the first solid component. The second solid component may be comprised of the same one or more particular chemical elements, however, the first chemical element of the one or more particular chemical elements is present in a second concentration in the second solid component, and the first and second concentrations are different. The first solid electrolyte may disposed or arranged between the first and second solid components. The first solid electrolyte is a dielectric material. The electric circuit is coupled with the electrochemical cell and configured to operate the electrochemical cell, according to a redox process, in which the first chemical element is exchanged between the first solid component and the second solid component. The exchange changes an electrical conductance of each of the first and second solid components.

According to a first aspect, the present invention is embodied as an electrochemical device. The device includes an electrochemical cell and an electric circuit. The electrochemical cell comprises two solid components, i.e., a first solid component and a second solid component. The two solid components comprise same chemical elements but have different concentrations of at least one type of said chemical elements. Each of the first solid component and the second solid component may for example be formed as a layer of material. A solid electrolyte is arranged between the two solid components. The solid electrolyte is a dielectric material. The electric circuit is connected to the electrochemical cell. It is generally configured to operate the cell according to a redox process, so as to exchange chemical elements of said at least one type between the first solid component and the second solid component and thereby change an electrical conductance of each of the two solid components, in operation.

Thus, the solid components have a symmetric composition; they play the role of a cathode and an anode. As they differ in terms of concentrations of one or more of the chemical elements they have in common, one of said solid components can be converted to the other one by a redox process, one of the solid components being a reduced form of the other. The operation of the device is very simple and can be exploited so as to read out a conductance (or resistance, or changes to such a conductance or resistance) in the second solid component. The use of solid components makes the above device well amenable to integration in hardware. In particular, such a device can be used as a synaptic element in neuromorphic circuitry, so as to process cognitive workloads. The electrochemical principle exploited makes the device a non-volatile device, which can advantageously be used to store and modify weights of a synaptic element of neuromorphic hardware.

In embodiments, said two solid components comprise, each, a compound of at least two chemical elements, and have different concentrations of one of said at least two chemical elements.

Preferably, each of the two solid components comprises $WO_3$, though one of the component is the reduced form of the other, in operation of the device.

In preferred embodiments, the solid electrolyte comprises a high-κ dielectric material. The solid electrolyte may for example comprise $HfO_2$, through which intercalation ions are exchanged between said two solid components, in operation.

In embodiments, the electric circuit includes two circuits, i.e., a first circuit and a second circuit. The first circuit connects the first solid component to the second solid component, in order to operate the cell according to said redox process, in operation. The second circuit is closed by the second solid component. The second circuit is configured to sense an electrical signal impacted by the change of electrical conductance occurring in the second solid component, in operation of the device.

Preferably, the electrochemical cell further comprises three electrical contacts, the latter consisting of a source contact, a drain contact, and a gate contact. Each of the source contact and the drain contact is in electrical communication with the second solid component, whereas the gate contact is in electrical communication with the first solid component. The first circuit connects to each of the source contact and the gate contact. The second circuit connects to the source contact and the drain contact. For example, the electrochemical cell may be configured as a three-terminal device having three electrical contacts consisting of said source contact, said drain contact, and said gate contact.

Preferably, the device further comprises a substrate, the second solid component extends on top of the substrate, the source contact and the drain contact are, each, in electrical communication with the second solid component, the solid electrolyte extends on top of the second solid component, in contact therewith, the first solid component extends on top of the solid electrolyte, in contact therewith, and the gate contact is arranged on top of the first solid component, in contact therewith.

In embodiments, each of the source contact and the drain contact is arranged on top of the second solid component, in contact therewith, and the solid electrolyte extends between the source contact and the drain contact.

In some embodiments, the substrate comprises a doped substrate. In variants, an insulating (or semiconducting) substrate is used. In preferred embodiments, the electric circuit further includes a third circuit, the latter connecting the doped substrate to a ground.

Preferably, the cell further comprises a third solid component extending between the doped substrate and the second solid component. The third solid component comprises the same chemical elements as the first solid component and the second solid component but has a different concentration of said at least one type of said chemical elements compared to the second solid component. Said solid electrolyte is a first solid electrolyte and a second solid electrolyte extends between the third solid component and the second solid component, so as to be in contact with the third solid component and the second solid component.

In embodiments, the electric circuit further includes a third circuit, the latter connected to the first circuit, so as to connect the doped substrate to the first circuit.

The second solid component may possibly be structured as a fin. In that case, the source contact and the drain contact extend, each, on top of the substrate, so as to laterally contact the fin on each end thereof. In addition, the gate contact, the solid electrolyte, and the first solid component, are at least partly wrapped around the fin, e.g., so as to form a wrapping structure.

In preferred embodiments, the device comprises several wrapping structures arranged along the fin, separated from each other. Each of the wrapping structures is structured similarly as the above wrapping structure, so as to be at least partly wrapped, each, around the fin.

According to another aspect, the invention is embodied as an apparatus comprising a plurality of electrochemical devices such as described above. This apparatus further comprises a controller connected to the electric circuits of the devices, so as to operate the devices according to a redox process. Furthermore, a readout circuit is connected to the electric circuits of the devices. The readout circuit is configured to sense an electrical signal impacted by an electrical conductance of the second solid component of one or more of the electrochemical devices, in operation. The apparatus is preferably configured as an artificial neural network hardware, where each of the devices is configured as a synaptic element of the artificial neural network hardware.

According to a final aspect, the invention is embodied as a method of operating an electrochemical device. The method relies on a device such as described above, i.e., comprising an electrochemical cell, the cell including two solid components, namely a first solid component and a second solid component. The two solid components comprise same chemical elements but have different concentrations of at least one type of said chemical elements. The device further comprises a solid electrolyte arranged between the two solid components, where the solid electrolyte is a dielectric material. Finally, the device also includes an electric circuit connected to the electrochemical cell. According to the method, the electrical circuit is used to operate the electrochemical cell according to a redox process, so as to exchange chemical elements of said at least one type between the first solid component and the second solid component and thereby change electrical conductances of each of the two solid components, and sense an electrical signal impacted by the electrical conductance of the second solid component.

Devices, apparatuses, and methods embodying the present invention will now be described, by way of non-limiting examples, and in reference to the accompanying drawings.

BRIEF DESCRIPTION OF SEVERAL VIEWS OF THE DRAWINGS

The accompanying figures, where like reference numerals refer to identical or functionally similar elements throughout the separate views, and which together with the detailed description below are incorporated in and form part of the present specification, serve to further illustrate various embodiments and to explain various principles and advantages all in accordance with the present disclosure, in which.

Figure 1:
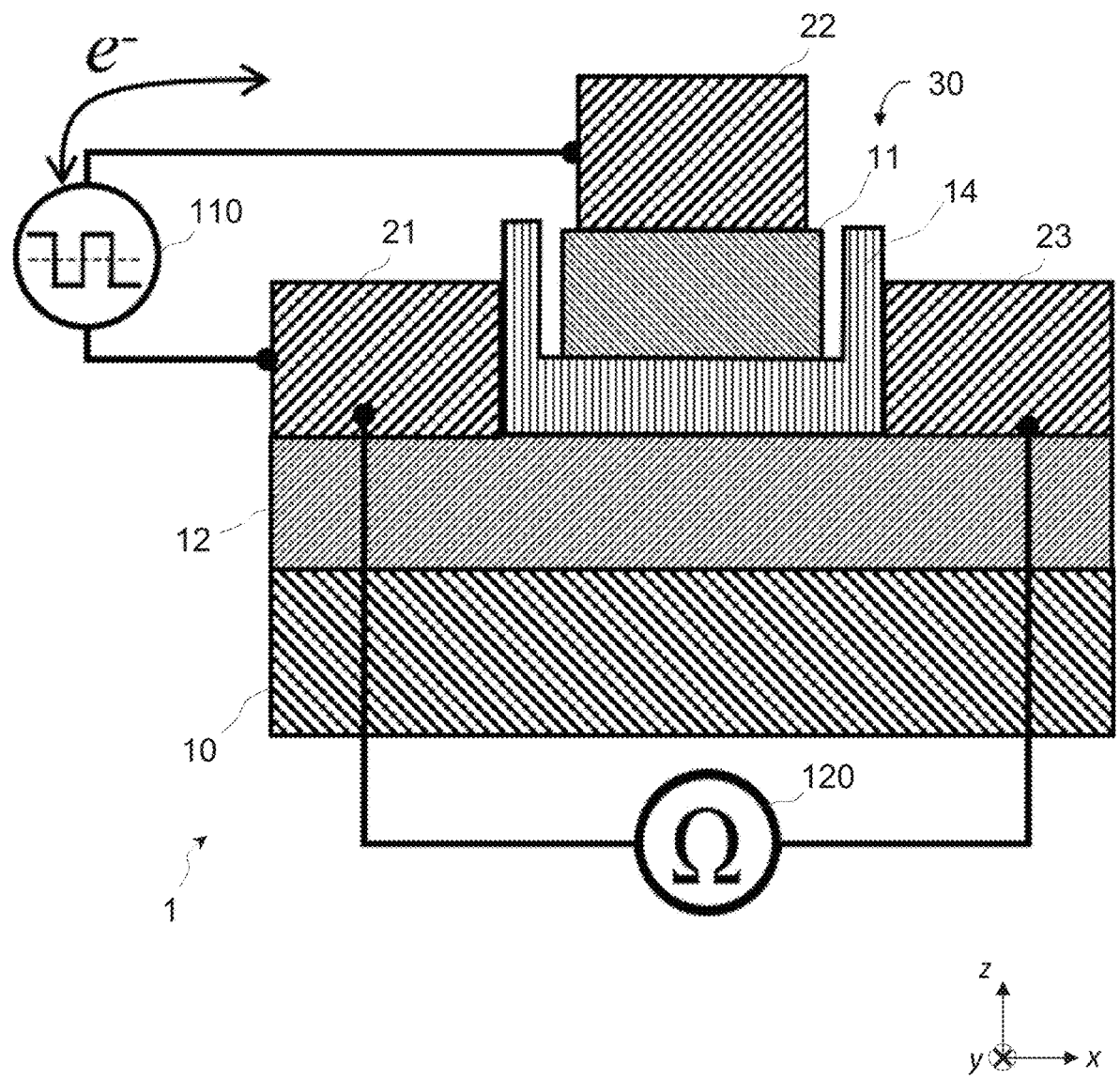
FIGS. 1 to 3 are two dimensional cross-sectional views of electrochemical devices according to embodiments of the invention.

The accompanying drawings show simplified representations of devices or parts thereof, as involved in embodiments. Technical features depicted in the drawings are not necessarily to scale. Similar or functionally similar elements in the figures have been allocated the same numeral references, unless otherwise indicated.

DETAILED DESCRIPTION OF EMBODIMENTS OF THE INVENTION

It has been suggested to use electrochemical devices in place of usual memristive devices for synaptic elements of neuromorphic hardware. Such devices generally have low power budget. However, various difficulties stem from their scalability, the lack of CMOS-compatibility and the allowed control on the reservoir stoichiometry (the reservoir is a component that can provide or store active ions enabling the ECRAM functionality, as a consequence of chemical reactions activated by electrical stimuli). In addition, these devices often rely on liquid electrolytes or organic solid electrolytes, which make them unsuitable for integration in neuromorphic hardware.

Willing to develop suitable electrochemical devices for integration in neuromorphic hardware, the present inventors came to develop various devices, which can satisfactorily be used in neuromorphic hardware. Such solutions are described in detail in the following description.

In reference to FIGS. 1-4, an aspect of the invention is first described, which concerns an electrochemical devices 1-4. The electrochemical devices 1-4 respectively comprise an electrochemical cell 30, 31, 32, 33. The electrochemical devices 1-3 and the apparatus 100 shown in FIG. 5 include an electric circuit 110-150, which typically includes several circuit portions, having distinct functions.

The electrochemical cells 30, 31, 32, 33 include two solid components 11, 12, i.e., a first solid component 11 and a second solid component 12. The two solid components 11, 12 may comprise the same chemical elements, though one or more of the chemical elements may be present in different concentrations in the solid components 11, 12. For example, a particular chemical element is present in a first concentration in solid component 11 and the same particular chemical element is present in a second concentration in solid component 12, wherein the first and second concentrations are different. Thus, the components 11, 12 have different concentrations of at least one type of the chemical elements they have in common. In operation, this may result in a low open circuit voltage. For example, the components 11, 12 may include binary compounds differing in terms of concentration of one element.

The electrochemical cells 30, 31, 32, 33 may also include a solid electrolyte 14 arranged between the two solid components 11, 12. The solid electrolyte is a dielectric material. The solid electrolyte 14 may for example comprise a high-κ dielectric material, e.g., $HfO_2$ (Hafnium(IV) oxide), wherein oxygen ions are used as intercalation ions, i.e., ions moving between the components 11 and 12. (Kappa in "high-κ" refers to the dielectric constant.) Such ions pass through the electrolyte 14, which plays the role of an ionic conductor, but does not conduct electron current. Using oxygen as intercalation ion makes it possible to circumvent some of the problems posed by the use of Li-based devices, as mostly found in the literature (safety flaws, energy density, etc.).

The electric circuits 110-140 are connected to the electrochemical cells 30, 31, 32. The electric circuit 150 is connected to the electrochemical cells of apparatus 100. The circuits are generally configured to operate the cells according to a redox process. The redox process can be chemical (e.g., in hydrogen atmosphere), or electrochemical (e.g., by applying a negative/positive bias voltage). This causes an exchange chemical elements of said at least one type between the first solid component 11 and the second solid component 12, in operation of the device. This exchange, in turn, causes a change in the electrical conductance of each of the two solid components 11, 12.

Thus, the solid components 11, 12 play the role of a cathode and an anode. As they differ in terms of concentrations of one or more of the chemical elements they have in common, one of the solid components can be converted to the other one by a redox process, in operation of the devices 1-4. That is, one of the solid components is a reduced form of the other, in operation. This can be exploited so as to read out a conductance (or resistance, or changes to such a conductance or resistance) in the second solid component, as in embodiments discussed later.

The devices 1-4 may be fabricated as a multilayer device, see, e.g., FIGS. 1-4. The solid electrolyte 14 and the solid components 11, 12 of the electrochemical cells 30, 31, 32, 33 may, for instance, be formed as material layers, possibly structured. The use of solid components makes the device amenable to integration in hardware. In particular, such a device can be used as a synaptic element in neuromorphic circuitry, so as to process cognitive workloads. The electrochemical principle exploited makes the device a non-volatile device, which can advantageously be used to store and modify weights of a synaptic element of neuromorphic hardware.

All this is now described in detail, in reference to particular embodiments of the invention. To start with, the two solid components 11, 12 shall preferably comprise, each, a compound of at least two chemical elements, and have different concentrations of one of the at least two chemical elements. For example, the solid components 11, 12 may comprise exactly two elements. E.g., they may comprise $WO_3$ (tungsten trioxide). The use of symmetric, $WO_3$-based solid components makes the device CMOS-compatible and a device can be integrated in the back end of the line (BEOL) of a CMOS process. Incidentally, using $WO_3$-based solid components is particularly advantageous when using a high-κ dielectric material such as $HfO_2$, as $HfO_2$ is a good ion conductor (but not electron conductor), allowing oxygen ions to be suitably (de-)intercalated between the two solid components of $WO_3$.

In various embodiments, other materials can be contemplated for the solid components 11, 12 and the solid electrolyte 14. For example, the solid components 11, 12 may comprise, each, strontium titanate oxide ($SrTiO_3$, or STO for short). In variants, they may for example include Perovskites ($SrFeO_x$, $SrCoO_x$, $CaCrO_x$), solid solutions: $BaInO_x$—$BaZrO_x$, $SrTiO_x$—$SrCoO_x$, other oxides ($La_2NiO_4$, $La_2CuO_4$), or non-oxygen-based compounds (such as $Li_xCoO_2$ and $Na_xCoO_4$). Moreover, the solid electrolyte 14 may, for instance, comprise $Ta_2O_5$, or yttrium-doped zirconium oxide ($Y:ZrO_2$, or YZO), or $CeO_2$, or a non-oxide oxygen electrolyte ($LaF_3$), or any other electrolyte suited for the (de-) intercalated species.

Figure 2:
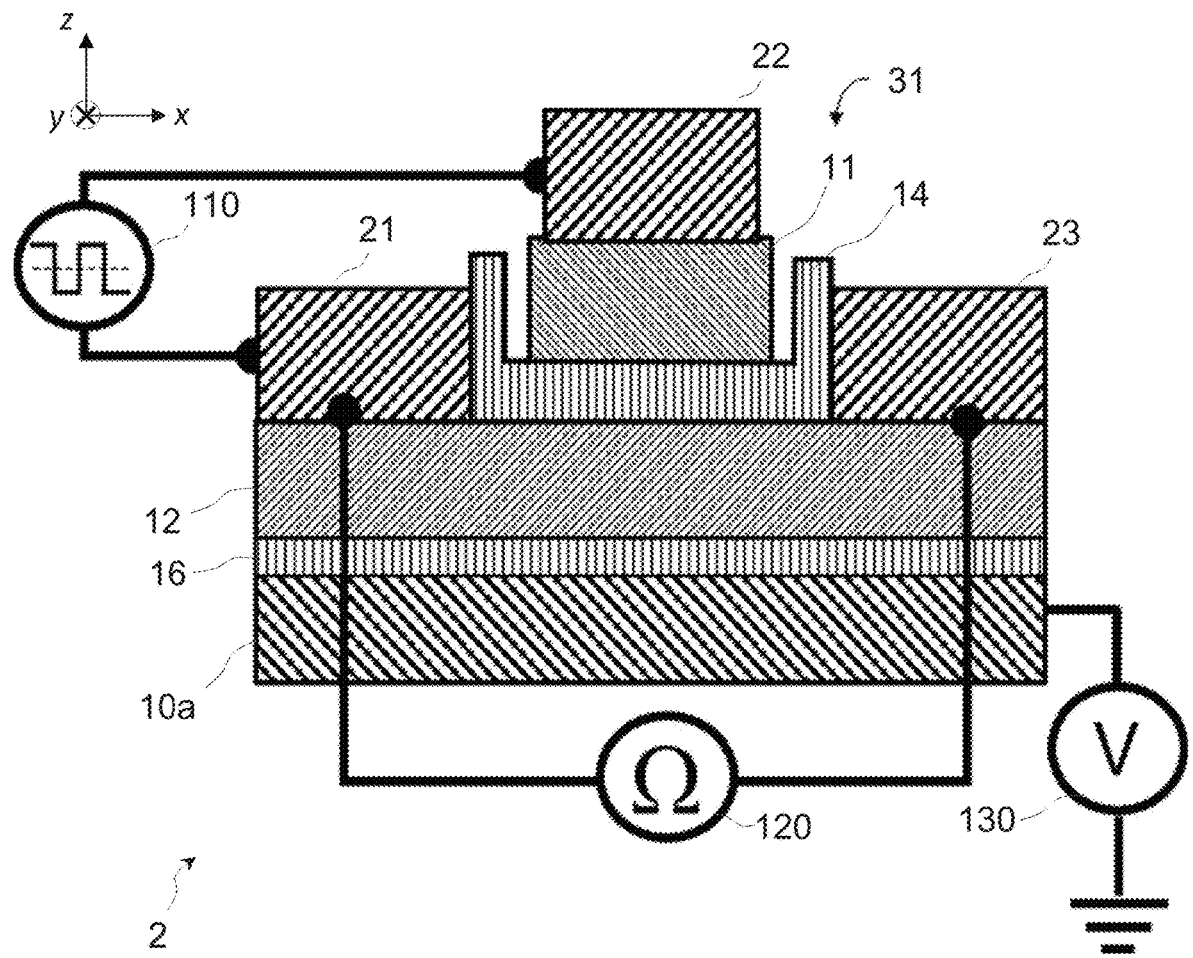
Figure 3:
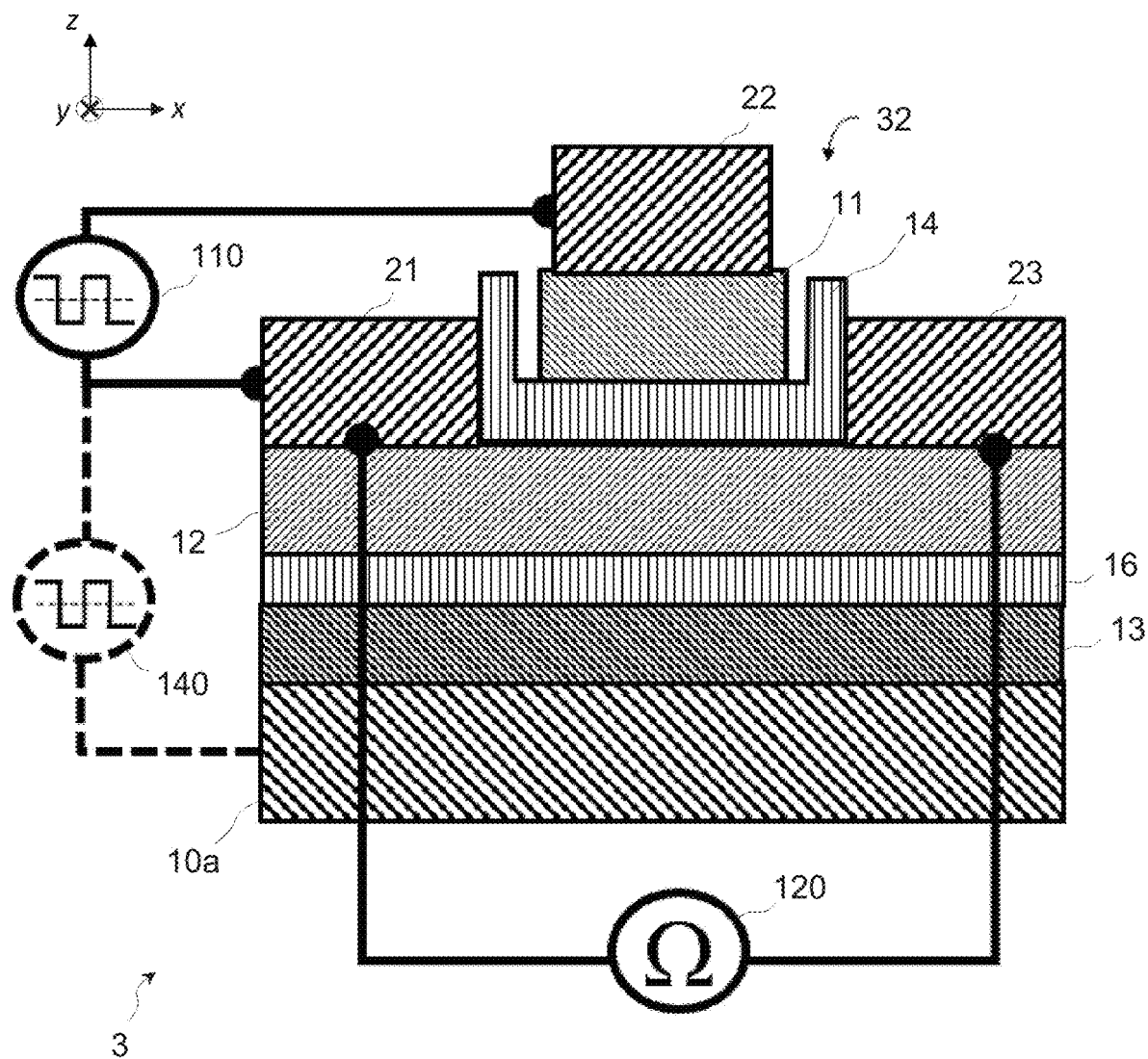

In embodiments such as depicted in FIGS. 1-3, the electric circuit of the devices 1-3 decomposes into two distinct (though connected) electrical circuits (or circuit portions), i.e., a first circuit 110 and a second circuit 120. The first circuit 110 connects the first solid component 11 to the second solid component 12 via a contact 21. The circuit 110 is generally designed to allow the cell 30, 31, 32 to be operated according to a redox process, as recited above. The first circuit 110 typically comprises a voltage or current source, to drive the redox process, as assumed in the accompanying drawings. A current source is preferred as it makes it easier to gauge ionic charges moving during the redox process.

The second circuit 120 is provided to sense some electrical signal impacted by the change of electrical conductance that notably occurs in the second solid component 12, in operation of the devices 1-4. Note, the second circuit 120 is closed by the second solid component 12 (also referred to as a "channel" in this document) and is thus impacted by electrical properties of the the second solid component 12.

The second circuit 120 may for example be designed to sense a current and thereby read, e.g., a resistance or a conductance, of the second solid component 12. The change of conductance of the channel 12 is due to ions that reached or left the channel 12 due to the redox process; it can be regarded as a non-volatile change of the channel's conductivity.

As shown in FIGS. 1-4, the electrochemical cells 30, 31, 32, 33 preferably comprise three electrical contacts, i.e., a source contact 21, a drain contact 23, and a gate contact 22. The source contact 21 and the drain contact 23 are, each, in electrical communication with the second solid component 12, whereas the gate contact 22 is in electrical communication with the first solid component 11. As seen, the first circuit 110 connects to each of the source contact 21 and the gate contact 22, while the second circuit 120 connects to the source contact 21 and the drain contact 23.

As such, the devices 1-4 can be regarded as a FET-like device (i.e., a device resembling a field-effect transistor), inasmuch as the flow of current can be controlled by the application of a voltage to the gate which may be supplied by the first circuit 110, which in turn alters the conductivity between the drain and the source, as measured by the second circuit 120. In particular, the electrochemical cells 30, 31, 32, 33 can be configured as a three-terminal device 1-4, i.e., a device having three electrical contacts consisting of the source contact 21, the drain contact 23, and the gate contact 22.

In the example of FIG. 1, the device includes only three electrical contacts 21-23 and the substrate 10 is electrically insulating. The substrate must indeed be insulating in this case, in order to prevent reading current passing through the substrate when reading the channel 12. Note, however, that the substrate 10 may include or be an undoped semiconductor material like silicon.

As seen in FIGS. 1-4, the device 1-4 may essentially have a layer structure. For example, each of the first solid component 11 and the second solid component 12 may be formed as a layer of material. Similarly, the solid electrolyte 14 may be formed as a layer of material too, though the solid electrolyte 14 is preferably structured (e.g., to exhibit a raised rim, as shown in the figures), so as to avoid shorts between the source contact 21 or drain contact 23 and the first solid component 11.

The devices 1-3 are preferably structured as follows. The second solid component 12 extends on top of a substrate 10. The source contact 21 and the drain contact 23 are, each, in electrical communication with the second solid component 12. In addition, the solid electrolyte 14 extend on top of the second solid component 12, so as to contact the latter. Next, the first solid component 11 extends on top of the solid electrolyte 14, in contact therewith. And finally, the gate contact 22 is arranged on top of the first solid component 11, in contact with this component 11. Note, "on top" means "above, and either in contact with or at a distance of." That is, intermediate layers of additional materials may possibly be needed, provided they do not significantly alter the desired electrical paths. "Above" is in the z direction.

In the example structures shown in FIGS. 1-3, each of the source contact 21 and the drain contact 23 is arranged on top of the second solid component 12, in contact therewith. In addition, the solid electrolyte 14 extends between the source contact 21 and the drain contact 23. Note, the source 21 and drain contact 23 may possibly be in direct contact with the solid electrolyte 14, laterally, for the sake of compactness or footprint, as assumed in FIGS. 1-3. This, however, has no consequence since the solid electrolyte is a dielectric material.

In the examples of FIGS. 2 and 3, the substrate 10a comprises a doped material, contrary to FIG. 1, because of the additional contact to the substrate. Practically, the substrate 10 can for instance include a doped region, implanted so as to be isolated from the ground, similar to implanted n-wells in p-type silicon of usual MOSFET circuits.

In the example of FIG. 2, the overall electric circuit further includes a third circuit portion 130 that connects the doped substrate 10a to the ground. Note, the device 2 can still be regarded as a FET-like device, despite the additional contact. The third circuit 130 and the additional contact on the doped substrate are meant to dynamically control the FET. This circuit 130 allows, together with the top contact 22, ions to intercalate to layer 12 or, conversely, to de-intercalated from this layer 12. The circuit 130 acts as a volatile field effect. Thus, two effects are obtained in the same device 2 in that case. The first effect is a non-volatile effect, obtained from the electrochemical operation via the circuit 110, while the second effect obtained via the circuit 130 is volatile. In other words, the circuit 130 allows an electrical potential to be applied to the substrate 10a with respect to the ground, making the substrate act as a gate.

In addition, in FIGS. 2 and 3, another dielectric layer 16 extends on top of the doped substrate 10a, i.e., between the second solid component 12 and the substrate 10a. This layer 16 can for instance comprise $HfO_2$, just like the solid electrolyte 14, or any other dielectric material, such as $Ta_2O_5$, or YZO.

In the example of FIG. 3, the cell 32 further comprises a third solid component 13, which extends between the doped substrate 10a and the second solid component 12. The third solid component 13 comprises the same chemical elements as the first solid component 11 and the second solid component 12. However, the third solid component 13 will have a different concentration of one or more of the chemical elements that layers 11-13 have in common, at least when compared to the second solid component 12. As before, the difference of concentration may concern only one element. Still, the initial concentrations of this element could for instance be the same in the first and third solid component 13, to achieve a symmetric ion exchange layer structure.

The cell 32 also includes a second solid electrolyte 16 in this example. That is, two solid electrolytes are provided in that case. The solid electrolyte 16 extends between the third solid component 13 and the second solid component 12. The second electrolyte 16 is in contact with each of the lower layer (the third solid component 13) and the upper layer (the second solid component 12).

Preferably, the electric circuit of the device 3 also includes a third circuit 140. However, contrary to the circuit 130 of FIG. 2, here the circuit 140 connects to the first circuit 110, so as to connect the doped substrate 10a to the first circuit 110. Again, the third circuit 140 may include a voltage source or a current source, as assumed in FIG. 3. The device 3 can be regarded as a four-terminal, dual gate-like device (with a symmetric ion exchanging layer structure).

The circuit 140 is meant to operate the device using two gates, i.e., the top gate (based on circuit 110, as in FIG. 1) and the substrate (based on circuit 140). This feature offers more flexibility in, e.g., operating artificial synapses comprising the device 3. Namely, the third circuit 140 may provide another source of pulses (e.g., current or voltage pulses) like the circuit 110. The total synapse response can, for example, stem from a double redox process occurring in the channel 12, due to the first gate, the second gate, or a combination of effects arising from both gates. In other words, a structure such as shown in FIG. 3 provides another way to increase the active section of the channel material, which changes the conductance of the channel 12, similarly as in FinFETs where multiple interfaces between the gate and the channel can be exploited for deintercalation purposes. The circuit 140, however, is optional.

Figure 4:
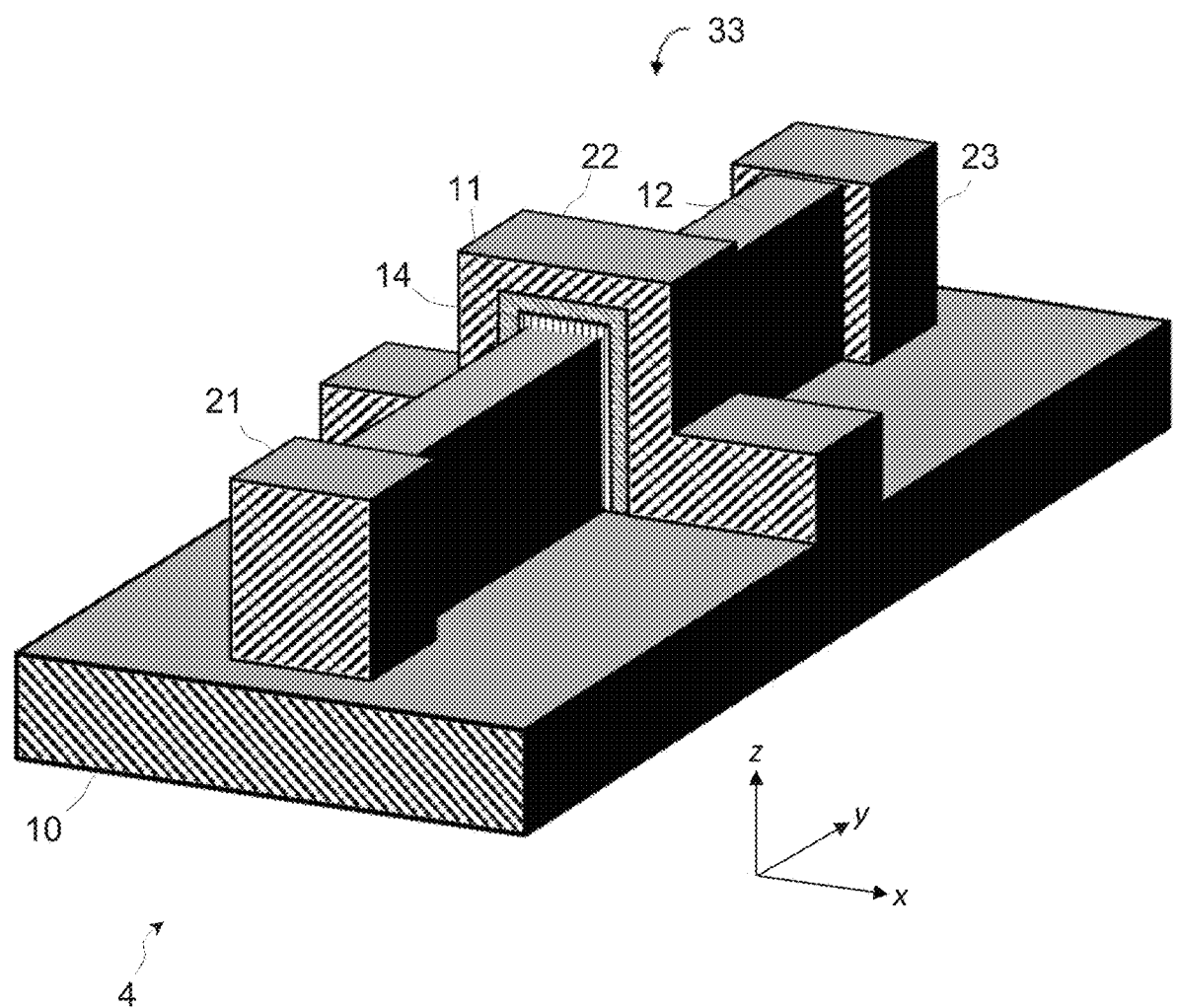
FIG. 4 is a three dimensional view of an electrochemical device according to a further embodiment.

The embodiment shown in FIG. 4 involves an alternative structure, in which the second solid component 12 is structured as a fin. In addition, the source contact 21 and the drain contact 23 extend, each, on top of the substrate 10, so as to laterally contact the fin 12 on each end thereof. Moreover, the solid electrolyte 14, the first solid component 11, and the gate contact 22, are at least partly wrapped around the fin 12, as successive layers 14, 11, 22 (in this order). The wrapping structure formed by the gate contact 22, the solid electrolyte 14, and the first solid component 11 may thus possibly contact the fin 12 on two or more sides thereof (e.g., on three sides, assuming a rectangular cross-section for the fin, as in the example of FIG. 4). Such a structure can be regarded as a FinFET-like device 4 with multiple ion exchanging layers, which again allows more flexibility in the operation of the device (compared to the example of FIG. 1), in a compact and easy-to-fabricate way.

The substrate is also insulating in this example, at least if only two components 11, 12 are used, which are separated by the electrolyte 14. The need of doped substrate comes into play when additional circuits are present, in order to obtain multi-gates (from the top and bottom or when use is made of the FET function).

Note, however, that the device 4 may optionally comprise several wrapping structures (not shown for the clarity of depiction), each being similar to the wrapping structure shown in FIG. 4 described above, that is, the succession of layers 14, 11, and 22, wrapping around the fin and shaped complementarily therewith. That is, each of the resulting wrapping structures is structured similarly as the single wrapping structure shown in FIG. 4, so as to be at least partly wrapped around the fin 12. The multiple wrapping structures are arranged along the fin 12, though separated from each other, laterally.

A structure comprising multiple wrapping structures as described above makes it possible to obtain several gates, which are separated from each other. Using several gates allows a higher density to be achieved as it enables a parallel operation of a single fin 12. In particular, this may be used to increase the tunability of synaptic weights, when the device 4 is used in a neuromorphic apparatus. The weight is, in that case, captured by a value of resistance or conductance of the channel 12. The artificial synapse carries a weight for incoming stimuli arriving from the connected nodes and therefore changes the way the signal is further processed/propagated along the nodes. The weight value impacts currents read in output, as explained later in reference to a second aspect of the invention.

Many of the features described in reference to FIGS. 1-4 may be combined. For example, embodiments can be directed to an electrochemical device, wherein the top layer and bottom layer (i.e., the solid components 11, 12 forming the anode and cathode) are composed of the same chemical elements (e.g., "A" and "X" for a binary compound), but one of the elements (say "X") differs in terms of concentration, resulting in low open circuit voltage. This distinguishes the electrochemical device from solid-state batteries and solid oxide fuel cells, inasmuch as this feature results in low cell voltages, which is undesirable for batteries but desirable for devices such as synaptic devices. As explained earlier, one compound (solid component 11) can be converted into the other compound (solid component 12) by virtue of the redox process. A first electrical circuit 110 is formed between a contact on the top layer and a contact on the bottom layer, while a second electrical circuit 120 is formed between contacts on the same bottom layer. The element of variable concentration ("X") is exchanged between the layers corresponding with solid components 11 and 12 through a solid electrolyte 14 by means of an electrical signal applied through the first electrical circuit 110, as opposed to conventional field-effect devices. The conductivity of the bottom layer changes as a function of the concentration of the variable concentration element ("X") therein. The device can for instance be structed as a 3-terminal device, using decoupled programming and reading operations. The solid component 11 (which may be considered a reservoir) and the channel 12 can advantageously comprise $WO_3$, where the composition in one of the components 11, 12 is the reduced form of the other. Finally, the solid electrolyte preferably includes $HfO_2$. The starting $WO_x$ resistivity can be controlled and tuned during the deposition, using, e.g., a $H_+$/Ar reducing treatment. For the rest, the device can be fabricated using conventional lithographic processes.

Figure 5:
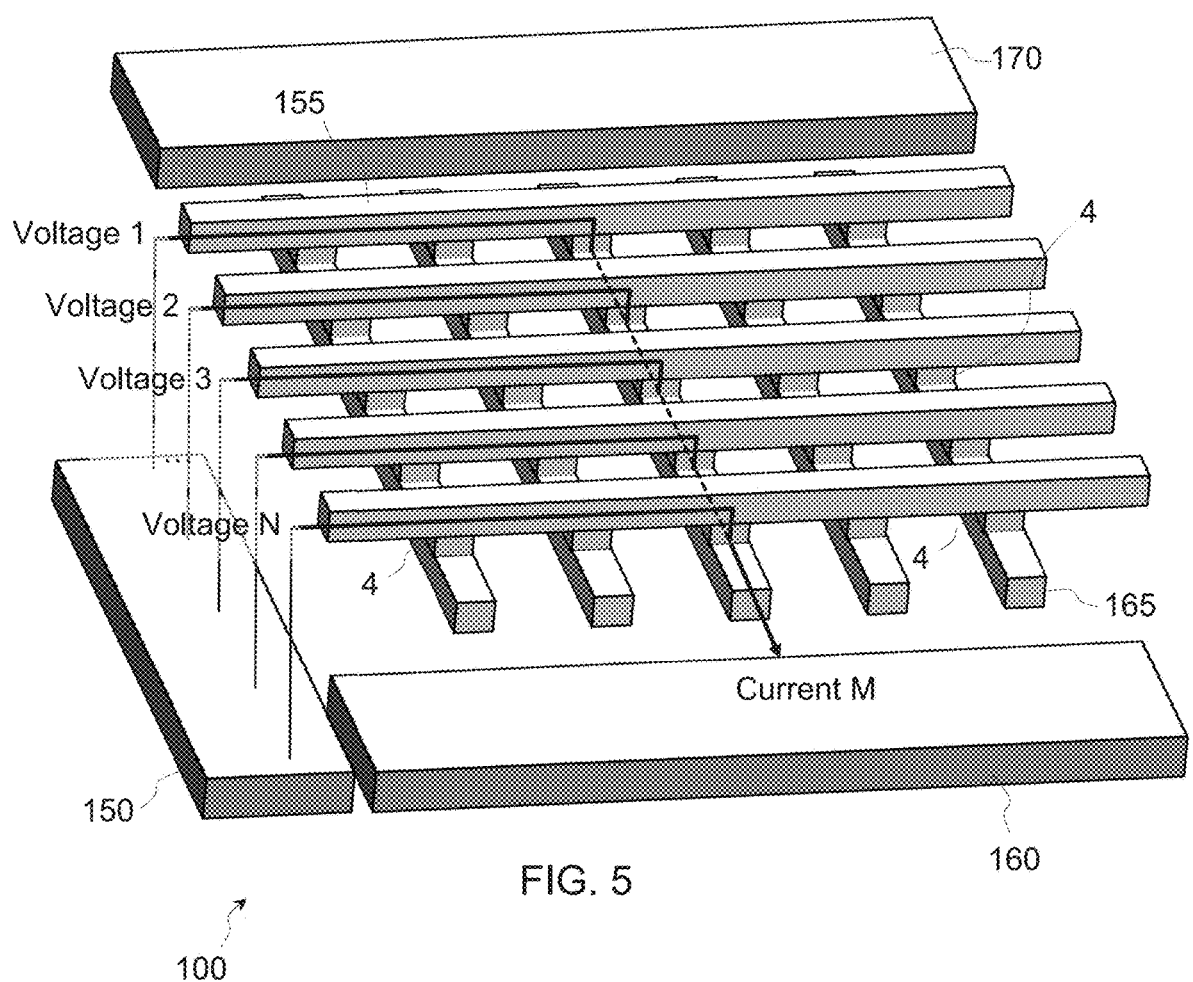
FIG. 5 is a 3 dimensional view of a neuromorphic apparatus comprising a crossbar array structure, whose input lines and output lines interconnect at junctions via electrochemical devices such as depicted in FIG. 4, according to embodiments.

Referring to FIG. 5, another aspect of the invention is now described, which concerns an apparatus 100.

As seen in FIG. 5, the apparatus 100 includes a plurality of electrochemical devices 4 such as described above. In addition, the apparatus includes a controller 170 (i.e., a programming circuit), which is connected to the electric circuits (e.g., circuit portions 110 as shown in FIGS. 1-3) of the electrochemical devices 4, so as to operate the devices 4 according to a redox process, as described earlier. Note the electrical connections between the controller 170 and the individual devices 4 are now shown, for the clarity of depiction.

Moreover, a readout circuit 160 is provided, which is again connected to the electric circuits (e.g., circuit portions 120 as shown in FIGS. 1-3) of the devices 4. The readout circuit 160 is configured to sense one or more electrical signals impacted by the electrical conductance of the channel(s). The channel(s) is(are) formed by the second solid component 12 of one or more of the electrochemical devices 4, in operation. Further components like an input circuit 150 and a processing unit may be needed, for reasons that will become apparent later.

Note, in FIG. 5, the input circuit 150, the readout circuit 160, and the controller 170 are typically meant to form part of a same processing core, together with the connecting structure formed by the electrical conductors 155 and 165. In variants, however, the components 150, 160, and 170 may be provided on separate chips, for example.

The apparatus 100 may notably be configured as a neuromorphic apparatus, as assumed in FIG. 5. There, each device 4 may form part of a respective synaptic element. Note, each device 4 may possibly include several wrapping structures, as noted earlier in respect to FIG. 5, while still playing the role of a single synaptic element 4. Each of the structures may include the solid electrolyte 14, the first solid component 11, and the gate contact 22, which are at least partly wrapped around the fin 12. Each of these wrapping structures may be spaced away or separated from each other along the fin 12, as shown in FIG. 5. Such an embodiment may for instance be compared to PCM synaptic elements, where multiple PCM devices are used to provide the total response of each synaptic element. An advantage of using several wrapping structures for each single synaptic element is to increase the tunability of the total resistance/conductance of the channel of said each synaptic device.

In the example of FIG. 5, the apparatus 100 comprises a crossbar array structure formed by N input lines 155 and M output lines 165. Only five input lines and five output lines are depicted in this example, for the sake of depiction. In practice, however, hundreds of input lines would likely be involved. Similarly, hundreds of output lines may be needed. The input lines and the output lines are interconnected at junctions, via N×M electronic devices, which include, each, an electrochemical device 4 such as described earlier.

The controller 170 may advantageously be an analog circuit, connected to a first circuit 110 as shown in FIGS. 1-3. The controller is used to program the devices 4, for them to store values or, more exactly, to have properties (e.g., electrical conductance) interpretable as such values. The devices 4 may accordingly be programmed to store synaptic weights.

A distinct analog circuit 150 can, for instance, be used to couple input signals (e.g., apply voltage biases) into the input lines 155, as indicated in FIG. 5.

The readout circuit 160 is configured to read out M output signals (e.g., electrical currents) obtained from the M output lines 165. The readout is typically carried out according to a multiply-accumulate operation, which takes into account signals (e.g., currents or voltages biases) coupled into each of the input lines 155. As per the multiply-accumulate operations performed, values stored on each of the electrochemical devices 4 impact the readout. The multiply-accumulate operation typically results in that signals coupled into the input lines are respectively multiplied by values stored on the devices 4 at the junctions.

Note, the architecture shown in FIG. 5 corresponds to a single layer of nodes of an ANN, rather than a multilayer network. This architecture may, in principle, possibly be expanded (or stacked) to embody several connected layers (hence capable of representing a multilayer network), or be connected to a core-to-core communication bus, possibly including digital processing units. Several crossbar array structures such as shown in FIG. 5 may possibly be interconnected via this communication bus. Note, each or any of the circuit 150-170 may possibly be embodied as a digital processing units too, provided that suitable convertors are provided to translate the signals (preferred is to rely on analog circuits, though, for efficiency reasons).

The weights as stored on the devices 4 are constant for inference purposes (they benefit from the stability of the electrochemical devices 4), whereas they need be iteratively reprogrammed for learning purposes. The computation of the weight updates is normally performed by a processing unit, whereas the crossbar array structure(s) is used to perform all the basic operations needed for the ANN (i.e., matrix vector products for the forward evaluation, products of transposed matrices and error gradient vectors for the backward evaluation, and vector outer products for updating weights), which involve large vector-matrix multiplications. For the learning phase, the analog circuit 170 can be used to re-program the devices 4, so as to alter synaptic weights stored thereon and, this, according to any suitable automatic learning process. However, a structure or neuromorphic device 100 such as shown in FIG. 5 can serve for both learning and inference purposes.

Figure 6:
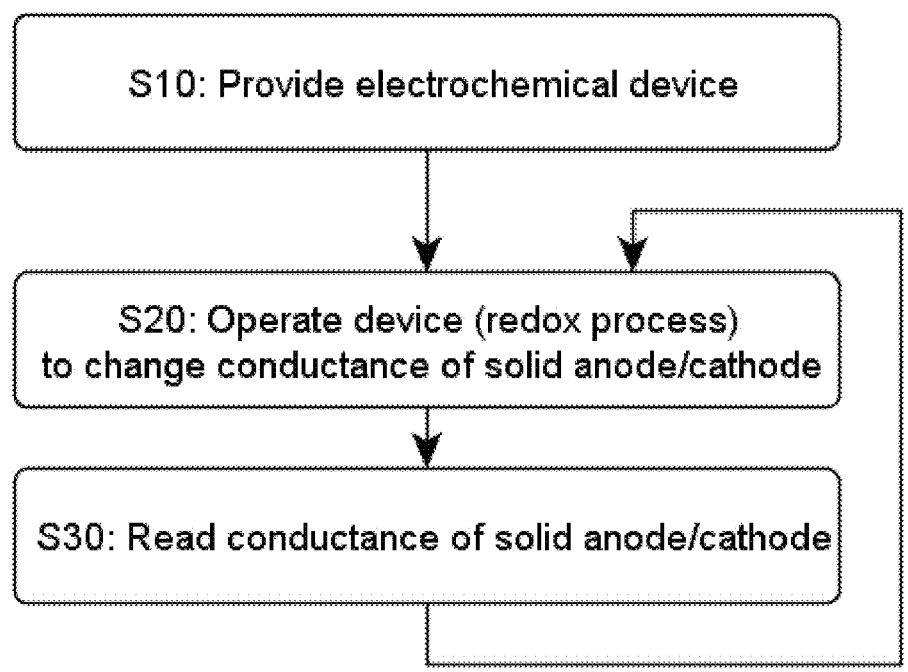
FIG. 6 is a flowchart illustrating high-level steps of a method of operating an electrochemical device, according to embodiments.

Referring to FIG. 6, a final aspect of the invention is now described, which concerns a method of operating an electrochemical device 1-4 or, by extension, an apparatus 100 such as described earlier in reference to FIGS. 1-5. Essential aspects of this method have already been described in reference to the present devices and apparatuses. This method is thus only succinctly described in the following.

In S10 an electrochemical device 1-4, such as described earlier is provided. That is, a device 1-4 is provided, where in the device comprises an electrochemical cell 30, 31, 32, 33 with two solid components 11, 12 that comprise same chemical elements but have different concentrations of one or more of the chemical elements they have in common. The electrochemical cell 30, 31, 32, 33 further comprises a solid electrolyte 14 (a dielectric material) arranged between the two solid components 11, 12. The device additionally includes an electric circuit 110-150 connected to the electrochemical cell.

As illustrated in the flowchart of FIG. 6, in S20, an electrical circuit is used to operate the cell 30, 31, 32, 33 according to a redox process, so as to exchange chemical elements between the solid components 11, 12 and thereby change conductances of each of the two components 11, 12.

In addition, in S30, an electrical circuit is used to sense an electrical signal impacted by the electrical conductance of the channel, i.e., the second solid component 12. The same principle can be exploited for a plurality of devices 1-4, as explained earlier in reference to FIG. 5. Also, steps S20 and S30 will typically be intermingled, e.g., for the purpose of training synaptic weights of a neuromorphic device 100.

While the present invention has been described with reference to a limited number of embodiments, variants and the accompanying drawings, it will be understood by those skilled in the art that various changes may be made and equivalents may be substituted without departing from the scope of the present invention. In particular, a feature (device-like or method-like) recited in a given embodiment, variant or shown in a drawing may be combined with or replace another feature in another embodiment, variant or drawing, without departing from the scope of the present invention. Various combinations of the features described in respect of any of the above embodiments or variants may accordingly be contemplated, that remain within the scope of the appended claims. In addition, many minor modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims. In addition, many other variants than explicitly touched above can be contemplated. For example, other materials than those explicitly cited herein may be used.

What is claimed is:

1. An electrochemical device comprising
an electrochemical cell including:
   a first solid component comprising one or more particular chemical elements, wherein a first chemical element of the one or more particular chemical elements is present in a first concentration in the first solid component,
   a second solid component comprising the one or more particular chemical elements, wherein the first chemical element of the one or more particular chemical elements is present in a second concentration in the second solid component, wherein the first and second concentrations are different, and
   a first solid electrolyte arranged between the first and second solid components, wherein the first solid electrolyte is a dielectric material; and
an electric circuit coupled with the electrochemical cell and configured to operate the electrochemical cell, according to a redox process, to exchange the first chemical element between the first solid component and the second solid component and thereby change an electrical conductance of each of the first and second solid components, wherein the first and second solid components each comprise $WO_3$.

2. The device of claim 1, wherein:
the first and second solid components each comprise a compound of at least two of the one or more particular chemical elements, each of the first and second solid components having a different concentration of one of the at least two chemical elements.

3. The device of claim 1, wherein
the electric circuit includes:
   a first circuit for operating electrochemical cell, the first circuit connecting the first solid component to the second solid component, and
   a second circuit for sensing an electrical signal, the second circuit having first and second terminals, each terminal connected to the second solid component.

4. The device of claim 3, wherein the electrochemical cell further comprises:
a source contact, a drain contact, and a gate contact, wherein each of the source contact and the drain contact is in electrical communication with the second solid component, and the gate contact is in electrical communication with the first solid component,
the first circuit connects to each of the source contact and the gate contact, and
the second circuit connects to the source contact and the drain contact.

5. The device of claim 4, wherein:
the device further comprises a substrate,
the second solid component extends on top of the substrate,
the source contact and the drain contact are, each, in electrical communication with the second solid component,
the first solid electrolyte extends on top of the second solid component, in contact therewith,
the first solid component extends on top of the first solid electrolyte, in contact therewith, and
the gate contact is arranged on top of the first solid component, in contact therewith.

6. The device of claim 5, wherein:
each of the source contact and the drain contact is arranged on top of the second solid component, in contact therewith, and the first solid electrolyte extends between the source contact and the drain contact.

7. The device of claim 5, wherein:
the substrate comprises a doped substrate.

8. The device of claim 7, wherein:
the electric circuit further includes a third circuit, the third circuit connecting the doped substrate to a ground.

9. The device of claim 7, wherein the electrochemical cell further comprises:
a third solid component extending between the doped substrate and the second solid component, wherein the third solid component comprises the one or more particular chemical elements, and the first chemical element of the one or more particular chemical elements is present in a third concentration in the third solid component, wherein the third concentration is different than the second concentration, and a second solid electrolyte extending between the third solid component and the second solid component, the second solid electrolyte in contact with the third solid component and the second solid component.

10. The device of claim 9, wherein:
the electric circuit further includes a third circuit, the third circuit connected to the first circuit, thereby connecting the doped substrate to the first circuit.

11. The device of claim 5, wherein:
the second solid component is a fin;
the source contact and the drain contact each extend on top of the substrate, laterally contacting the fin on each end thereof; and
the gate contact, the first solid component, and the first solid electrolyte are at least partly wrapped around a first portion of the fin.

12. The device of claim 11, further comprising:
a second gate contact, a component comprising same chemical elements in same concentrations as the first solid component, and a solid electrolyte comprising a same composition as the first solid electrolyte, the second gate contact, the component, and the solid electrolyte at least partly wrapped around a second portion of the fin, spaced away from the gate contact, the first solid component, and the first solid electrolyte that are at least partly wrapped around the first portion of the fin.

13. The device of claim 1, wherein:
each of the first solid component
and the second solid component is formed as a layer of material.

14. An electrochemical device comprising
an electrochemical cell including:
   a first solid component comprising one or more particular chemical elements, wherein a first chemical element of the one or more particular chemical elements is present in a first concentration in the first solid component,
   a second solid component comprising the one or more particular chemical elements, wherein the first chemical element of the one or more particular chemical elements is present in a second concentration in the second solid component, wherein the first and second concentrations are different, and
   a first solid electrolyte arranged between the first and second solid components, wherein the first solid electrolyte is a dielectric material; and
an electric circuit coupled with the electrochemical cell and configured to operate the electrochemical cell, according to a redox process, to exchange the first chemical element between the first solid component and the second solid component and thereby change an electrical conductance of each of the first and second solid components,
wherein the first solid electrolyte comprises a high-K dielectric material.

15. An electrochemical device comprising
an electrochemical cell including:
   a first solid component comprising one or more particular chemical elements, wherein a first chemical element of the one or more particular chemical elements is present in a first concentration in the first solid component,
   a second solid component comprising the one or more particular chemical elements, wherein the first chemical element of the one or more particular chemical elements is present in a second concentration in the second solid component, wherein the first and second concentrations are different, and a first solid electrolyte arranged between the first and second solid components, wherein the first solid electrolyte is a dielectric material; and an electric circuit coupled with the electrochemical cell and configured to operate the electrochemical cell, according to a redox process, to exchange the first chemical element between the first solid component and the second solid component and thereby change an electrical conductance of each of the first and second solid components, wherein the first solid electrolyte comprises: $HfO_2$.

* * * * *